United States Patent
Konishi

(10) Patent No.: US 6,936,873 B2
(45) Date of Patent: Aug. 30, 2005

(54) SOLID STATE IMAGING DEVICE AND METHOD FOR MANUFACTURING SOLID STATE IMAGING DEVICE

(75) Inventor: Minoru Konishi, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/382,413

(22) Filed: Mar. 5, 2003

(65) Prior Publication Data

US 2003/0168678 A1 Sep. 11, 2003

(30) Foreign Application Priority Data

Mar. 8, 2002 (JP) ........................................ 2002-063611

(51) Int. Cl.$^7$ ..................... H01L 27/148; H01L 29/768
(52) U.S. Cl. .................... 257/222; 257/232; 257/233; 257/290; 257/291; 257/294
(58) Field of Search ................. 257/222, 232, 257/233, 290, 291, 294, 590; 438/48, 70

(56) References Cited

U.S. PATENT DOCUMENTS

| | | | | | |
|---|---|---|---|---|---|
| 6,030,852 | A | * | 2/2000 | Sano et al. ................... | 438/69 |
| 6,040,591 | A | * | 3/2000 | Otsuka ....................... | 257/432 |
| 6,274,917 | B1 | * | 8/2001 | Fan et al. .................... | 257/432 |
| 6,362,498 | B2 | * | 3/2002 | Abramovich ................ | 257/233 |
| 6,414,343 | B1 | * | 7/2002 | Kondo et al. ................ | 257/294 |
| 6,448,596 | B1 | * | 9/2002 | Kawajiri et al. ............. | 257/292 |
| 6,580,105 | B1 | * | 6/2003 | Hatano et al. ............... | 257/222 |
| 6,586,811 | B2 | * | 7/2003 | Sekine ........................ | 257/432 |
| 6,635,911 | B2 | * | 10/2003 | Maruyama ................... | 257/291 |
| 6,677,627 | B2 | * | 1/2004 | Miida ......................... | 257/292 |
| 6,831,311 | B2 | * | 12/2004 | Uchida ........................ | 257/290 |
| 2001/0036014 | A1 | * | 11/2001 | Sasano et al. .............. | 359/619 |
| 2002/0167030 | A1 | * | 11/2002 | Miida .......................... | 257/215 |

FOREIGN PATENT DOCUMENTS

| | | |
|---|---|---|
| JP | 9-27608 | 1/1997 |
| JP | 2000-091548 | 3/2000 |
| JP | 2000-124435 | 4/2000 |

* cited by examiner

Primary Examiner—W. David Coleman
Assistant Examiner—Khiem Nguyen
(74) Attorney, Agent, or Firm—Sheridan Ross P.C.

(57) ABSTRACT

A solid state imaging device includes a transparent insulation film. The insulation film is laminated on transfer electrodes over the power supply lines. A transparent protection film, which has a refractive index that is greater than that of the insulation film, is laminated on the insulation film. The transparent insulation film has portions above the channels in which the thickness continuously increases from the center of adjacent channels to the associated channel separating region.

10 Claims, 4 Drawing Sheets

SOLID STATE IMAGING DEVICE AND METHOD FOR MANUFACTURING SOLID STATE IMAGING DEVICE

CROSS-REFERENCE TO RELATED APPLICATIONS

This application is based upon and claims the benefit of priority from the Japanese Patent Application No. 2002-63611, filed on Mar. 8, 2002, the entire contents of which are incorporated herein by reference.

BACKGROUND OF THE INVENTION

The present invention relates to a solid state imaging device having improved light receiving efficiency and a method for manufacturing such a solid state imaging device.

FIG. 10 is a schematic diagram illustrating a prior art frame transfer type solid state imaging device 1. The solid state imaging device 1 includes an imaging section 1i, a storage section 1s, a horizontal transfer section 1h, and an output section 1d. The imaging section 1i is configured by a plurality of vertical shift registers at predetermined intervals. Each bit of the vertical shift registers configures a light receiving pixel. The storage section 1s is configured by a plurality of vertical shift registers extending from the vertical shift registers of the imaging section 1i. The horizontal transfer section 1h is configured by a horizontal shift register, which is arranged at the output side of the storage section 1s. Each bit of the horizontal shift register is associated with one of the vertical shift registers. The output section 1d includes a capacitor, which receives information charges output from the horizontal transfer section 1h.

In such a prior art configuration, the information charges that are produced by the light receiving pixels in the imaging section 1i are stored in the light receiving pixels for a predetermined time and then transferred to the storage section 1s at a high speed in response to a frame transfer clock Øf. The information charges are temporarily stored in the storage section 1s and then sequentially transferred to the horizontal transfer section 1h in units of single lines in response to a vertical transfer clock Øv. The information charges transferred to the horizontal transfer section 1h are sequentially transferred to the output section 1d in units of single pixels in response to a horizontal transfer clock Øh and successively converted to a voltage value to be output as an image signal Y(t).

Referring to FIG. 12, a p-type diffusion layer 3, which functions as a device area, is formed on the planar surface of an n-type silicon substrate 2. A plurality of equally spaced parallel channel separating regions 4, in which p-type impurities having a high concentration are implanted, are arranged on the surface of the p-type diffusion layer 3. A plurality of n-type diffusion layers are formed between the channel separating regions 4 to define channels 5, which function as transfer routes for the information charges. A plurality of parallel polycrystalline transfer electrodes 7, which extend in a direction intersecting the channels 5, are arranged above the channels 5 with a thin gate insulation film 6, which is made of silicon oxide, arranged in between. As shown in FIG. 11, the three phases of frame transfer clocks Øf1, Øf2, and Øf3 are applied to the transfer electrodes 7. The clock pulses control the potential state at the channels 5.

An interlayer insulation film 9, which is made of the same material as the gate insulation film 6, is formed on the transfer electrodes 7. A plurality of power supply lines 8, which are made of, for example, aluminum, are arranged in the interlayer insulation film 9 in a manner covering the channel separating regions 4. The power supply lines 8 are connected to the transfer electrodes 7 via contact holes 11, which are formed in the interlayer insulation film 9 at predetermined intervals. For example, when performing three-phase driving, a contact hole 11 is provided for every third transfer electrode 7, and a power supply line 8 is provided for every third transfer electrode 7. The interlayer insulation film 9 covers the power supply lines 8. Further, a silicon nitride surface protection film 10 is applied to the interlayer insulation film 9.

In the above solid state imaging device, the power supply lines 8 are formed in a manner covering the channel separating regions 4 in a light receiving area. The aluminum material forming the power supply lines 8 generally has a characteristic that reflects light. Thus, in the light that enters the light receiving area in a uniform manner, the light received by the power supply lines 8 is reflected by the surface of the power supply line 8. Accordingly, the power supply lines 8 stops light from being guided to the channels 5. This results in a deficiency in that such light is not retrieved as information charges.

BRIEF SUMMARY OF THE INVENTION

In one aspect of the present invention, a solid state imaging device includes a semiconductor substrate having a planar surface. A plurality of channels are arranged in parallel spaced from each other at predetermined intervals on the planar surface of the semiconductor substrate. The solid state imaging device further includes a plurality of channel separating regions with each channel separating region arranged between a pair of adjacent channels. A plurality of transfer electrodes are arranged on the semiconductor substrate along a direction intersecting the channels. A plurality of power supply lines are arranged on the transfer electrodes along the channel separating regions. A transparent insulation film is laminated on the transfer electrodes covering the power supply lines. The transparent insulation film includes portions above the channels in which the thickness continuously increases from the center of each channel of a pair of adjacent channels to the channel separating region arranged between that pair of adjacent channels. A transparent protection film is laminated on the insulation film and has a refractive index that is greater than that of the insulation film.

A further aspect of the present invention is a method for manufacturing a solid state imaging device. The method includes disposing a plurality of channels in parallel spaced from each other at predetermined intervals on a semiconductor substrate, forming a plurality of channel separating regions with each region arranged between a pair of adjacent channels, extending a plurality of transfer electrodes on the semiconductor substrate along a direction intersecting the channels, forming a plurality of power supply lines on the transfer electrodes along the channel separating regions covering the channel separating regions, laminating a transparent insulation film having a predetermined thickness on the transfer electrodes, forming a mask pattern on the insulation film along the channels covering the power supply lines, anisotropically etching the insulation film along the mask pattern to decrease the thickness of the insulation film along the channels, isotropically etching the insulation film after the anisotropic etching to continuously increase the thickness of the insulation film above the channels from the center of each channel of a pair of adjacent channels to the channel separating regions between those channels, and laminating a transparent protection film having a refractive index that is greater than that of the insulation film on the semiconductor substrate.

Other aspects and advantages of the present invention will become apparent from the following description, taken in conjunction with the accompanying drawings, illustrating by way of example the principles of the invention.

BRIEF DESCRIPTION OF THE SEVERAL VIEWS OF THE DRAWING

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 1:
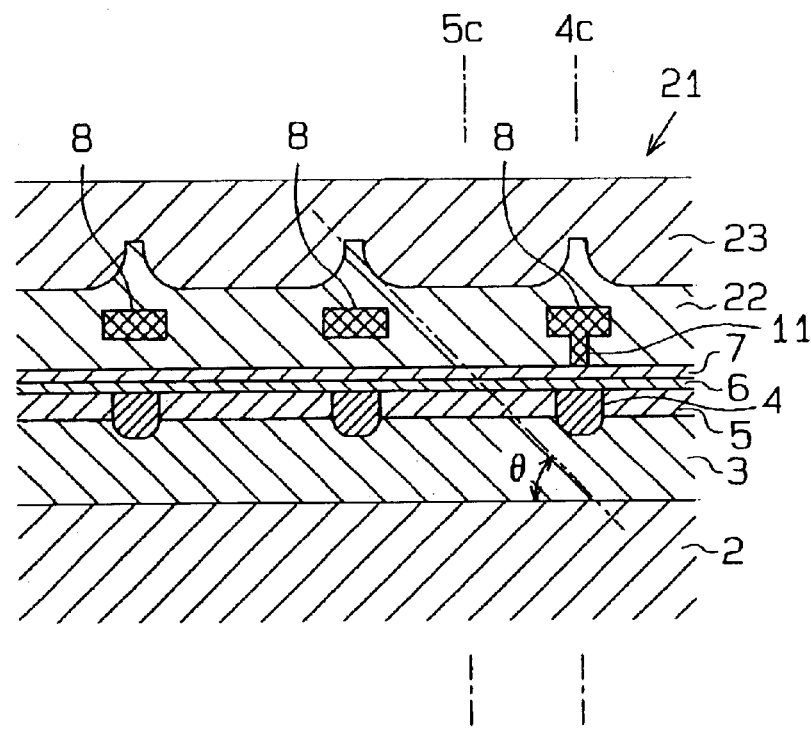
FIG. 1 is a cross-sectional view of a solid state imaging device according to a preferred embodiment of the present invention.
Figure 10:
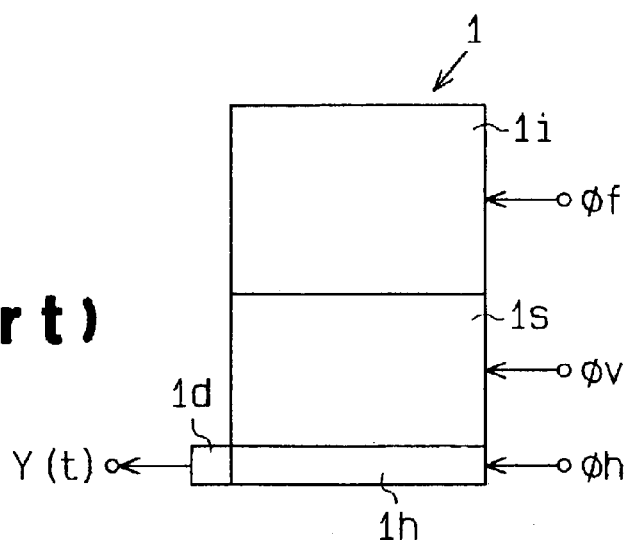
FIG. 10 is a plan view showing a prior art frame transfer type solid state imaging device.
Figure 11:
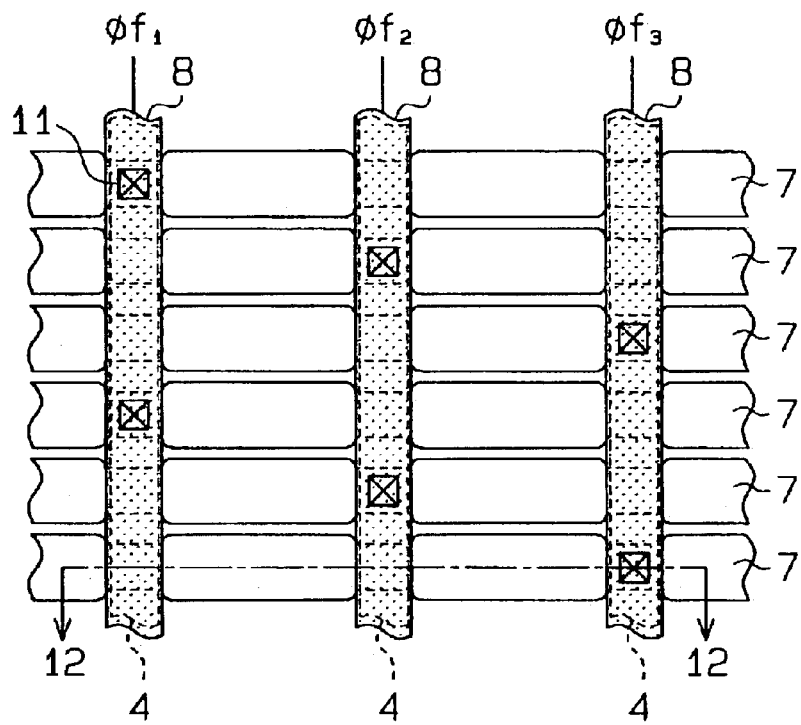
FIG. 11 is a plan view showing part of an imaging section in the solid state imaging device of FIG. 10.
Figure 12:
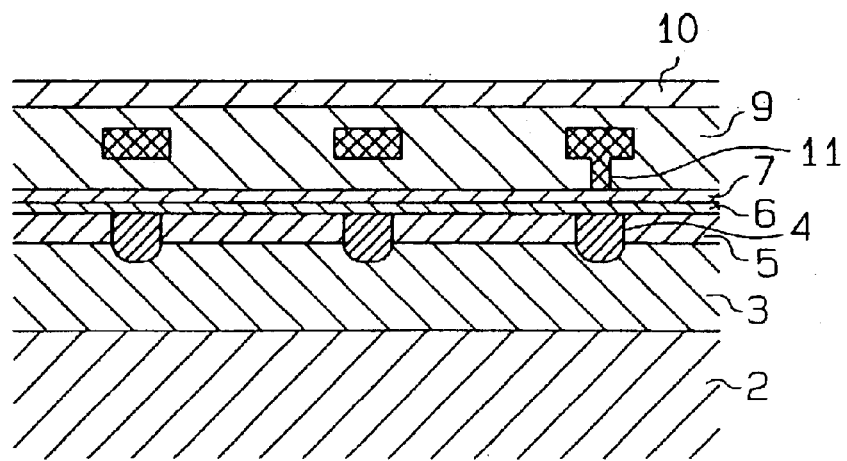
FIG. 12 is a cross-sectional view taken along line 12—12 in FIG. 11.

FIG. 1 is a cross-sectional view corresponding to FIG. 12, which shows a prior art example, and illustrates a solid state imaging device according to a preferred embodiment of the present invention. In FIG. 1, an n-type silicon substrate 2, a p-type diffusion layer 3, channel separating regions 4, channels 5, a gate insulation film 6, transfer electrodes 7, and power supply lines 8 are configured in the same manner as in the prior art example of FIG. 10.

The present invention differs from the prior art in that a transparent insulation film 22 is formed on the transfer electrodes 7. At portions above the power supply lines 8, the thickness of the insulation film 22 increases in a continuous manner from between adjacent channels 5, or from opposite sides of each channel separating region 4, toward the center 4c of the channel separating region 4. Further, a transparent protection film 23 having a refractive index that is greater than that of the protection film 23 is applied to the insulation film 22.

The insulation film 22 is formed from an optically transparent insulating material having a refractive index of, for example, 1.4 to 1.5. Further, the insulation includes a silicon oxide film 9a and a boron phosphorous silicate glass (BPSG) film 9b. That is, the insulation film 22 has a structure including at least two layers. In other words, the insulation film 22 of the preferred embodiment includes a first layer, or the silicon oxide film 9a, in which the power supply lines 8 are formed, and a second layer, or the BPSG film 9b, which is laminated on the power supply lines 8.

The insulation film 22 is shaped so that its thickness continuously increases from opposite sides (channel sides) of each channel separating region 4 to the center of the channel separating region 4. In the preferred embodiment, the interface between the insulation film 22 and the protection film 23 above the power supply lines 8 is gradually curved from a position corresponding to the vicinity of the center 4c of each channel separating region 4 to positions corresponding to the adjacent channels 5. The interface continuously extends toward positions corresponding to the center 5c of each channel 5 and becomes parallel to the surfaces of the channels 5.

The insulation film 22 includes portions above the channels 5 in which the thickness continuously increases from the center 5c of each channel 5 to the adjacent channel separating regions 4. The insulation film 22 further includes portions above the channel separating regions 4 in which the thickness continuously decreases from the center 4c of each channel separating region 4 to the adjacent channels 5.

When the channel separating regions 4 or the power supply lines 8 are wide enough, the curve of the interface between the insulation film 22 and the protection film 23 may terminate above the channel separating regions 4 so that the interface is planar and parallel to the surface of each channel 5.

The protection film 23 is made of an optically transparent material having a refractive index that is greater than that of the insulation film 22, such as silicon nitride, which has a refractive index of 2. The protection film 23 covers the entire surface of the insulation film 22 and has a flat surface.

In this manner, the transparent protection film 23, the refractive index of which is greater than that of the insulation film 22, is laminated on the insulation film 22, the thickness of which continuously increases from the channel sides to the center 4c of each channel separating region 4. Accordingly, parts of the insulation film 22 function as prisms above the power supply lines 8 and guide the light received by the power supply lines 8 to the channels 5. This efficiently converts the light irradiated on the light receiving area to information charges.

The interface between the insulation film 22 and the protection film 23 is curved near boundaries between the channel separating regions 4 and the channels 5. An angle θ formed between the surface of the n-type silicon substrate 2 and the tangent of the interface between the insulation film 22 and the protection film 23 increases at portions closer to the center of each power supply line 8. Thus, the refraction of the light received vertically by the surface of the n-type silicon substrate 2 is greater at portions closer to the center of each power supply line 8. This increases the amount of light that is efficiently guided to the channels 5.

In the preferred embodiment, silicon nitride is used as the material of the protection film 23. However, the material is not limited to silicon nitride in the present invention. Any transparent material having a refractive index that is greater than the insulation film 22 may be used as the material of the protection film 23. The tangential angle θ, which represents curved forms, may be adjusted in accordance with the refractive index of the material to obtain the same advantages as the preferred embodiment.

Figure 2:
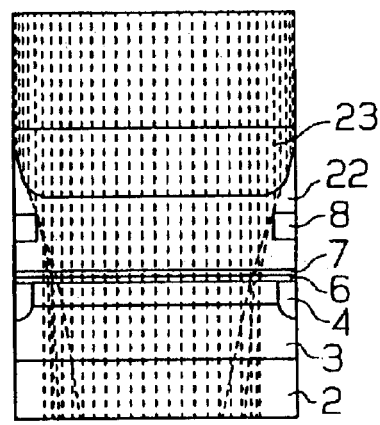
FIG. 2 is a diagram illustrating a light ray tracking simulation in the solid state imaging device of FIG. 1.

FIG. 2 illustrates a light ray tracking simulation result that was obtained when using the solid state imaging device of the preferred embodiment. It is apparent from FIG. 2 that the light received by the power supply lines 8 was efficiently collected at the channel sides.

The process for manufacturing the solid state device of the preferred embodiment will now be discussed with reference to FIGS. 3 to 9.

Figure 3:
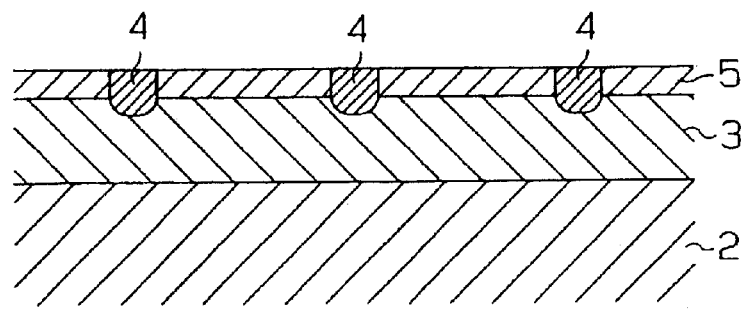
FIG. 3 is a cross-sectional diagram illustrating a first step performed when manufacturing the solid state imaging device of FIG. 1.

In a first step, which is illustrated in FIG. 3, p-type impurities, such as boron, are diffused on the surface of the n-type silicon substrate 2 to form the p-type diffusion layer 3, which functions as a device area. Further, p-type impurities are selectively implanted in the p-type diffusion layer 3 to form the channel separating regions 4. N-type impurities, such as phosphor, are implanted between the channel separating regions 4 to form n-type diffusion layers, which function as the channels 5.

Figure 4:
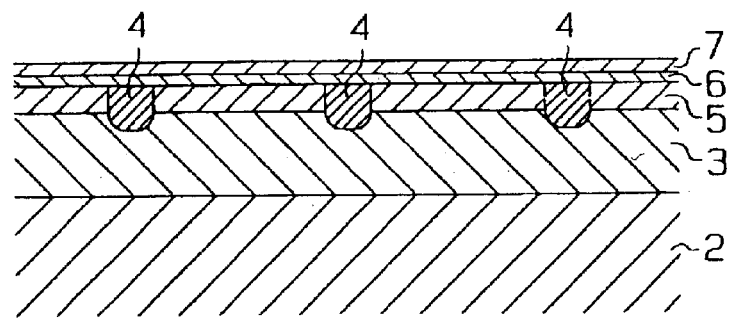
FIG. 4 is a cross-sectional diagram illustrating a second step performed when manufacturing the solid state imaging device of FIG. 1.

In a second step, which is illustrated in FIG. 4, the surface of the silicon substrate 2 on which the channel separating regions 4 and the channels 5 are formed is thermally oxidized to form the gate insulation film 6, which is made of silicon oxide. Chemical vapor deposition (CVD) is performed to form a polycrystalline silicon film on the gate insulation film 6. The polycrystalline silicon film is patterned so that it intersects the channels 5 to form the transfer electrodes 7.

Figure 5:
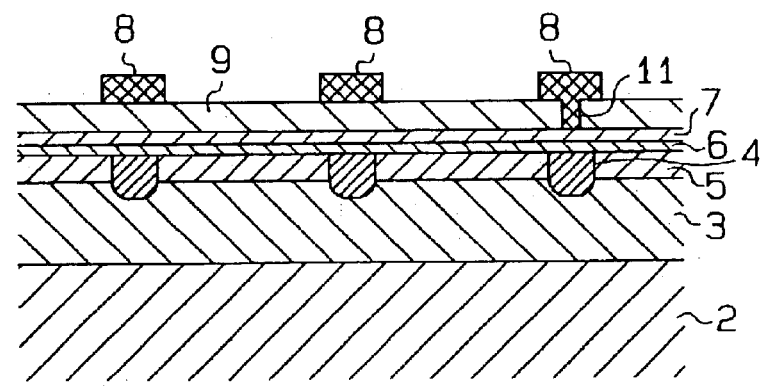
FIG. 5 is a cross-sectional diagram illustrating a third step performed when manufacturing the solid state imaging device of FIG. 1.

In a third step, which is illustrated in FIG. 5, CVD is performed to laminate silicon oxide on the transfer electrodes 7 and form a first layer, or the silicon oxide (insulation) film 9a. A contact hole 11 is formed in the silicon oxide film 9a above a channel separating region 4. Aluminum is laminated on the silicon oxide film 9a and patterned to a predetermined shape to form the power supply lines 8.

Figure 6:
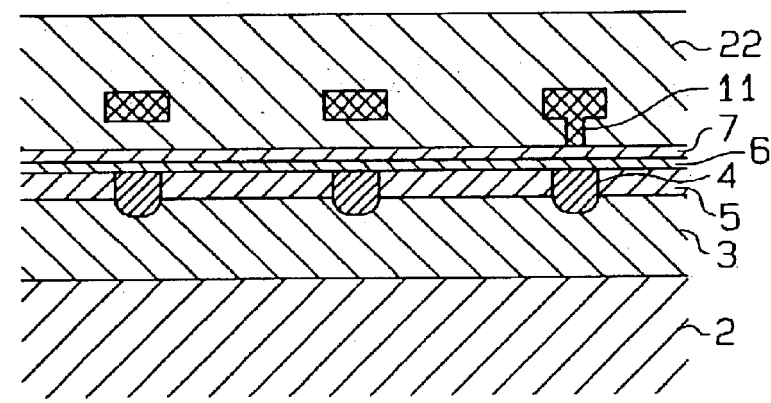
FIG. 6 is a cross-sectional diagram illustrating a fourth step performed when manufacturing the solid state imaging device of FIG. 1.

In a fourth step, which is illustrated in FIG. 6, CVD is performed to laminate the second layer, or the BPSG film 9b, on the silicon oxide film 9a, on which the power supply lines 8 are formed. The BPSG film 9b and the silicon oxide film 9a define the insulation film 22. The BPSG film 9b is etched in subsequent steps. Thus, in the fourth step, the BPSG film 9b is formed with a thickness that is greater than the maximum thickness subsequent to the etching. Further, the thickness is such that it enables the BPSG film 9b to be curved above the power supply lines 8. The surface of the BPSG film 9b is thermally processed to flatten the surface of the insulation film 22.

Figure 7:
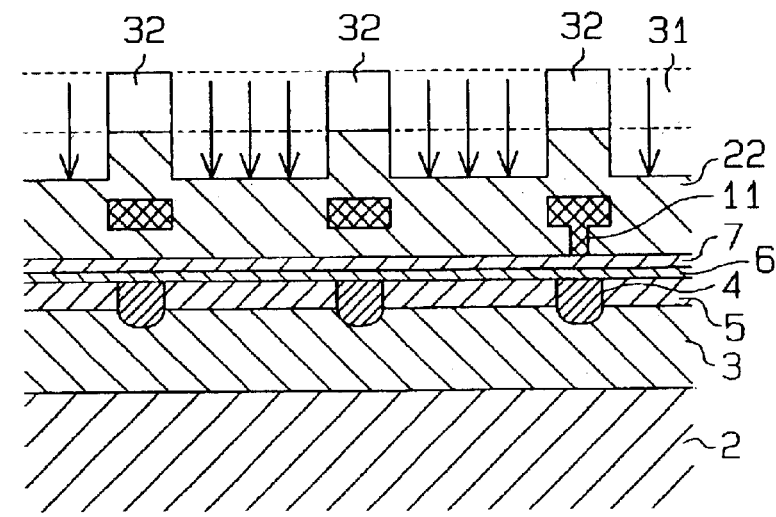
FIG. 7 is a cross-sectional diagram illustrating a fifth step performed when manufacturing the solid state imaging device of FIG. 1.

In a fifth step, which is illustrated in FIG. 7, a resist layer 31 is laminated on the insulation film 22 and patterned along the power supply lines 8 to form a mask pattern 32 that covers the power supply lines 8. Using the mask pattern 32 as a mask, anisotropic etching (e.g., dry etching) is performed on the insulation film 22 to decrease the thickness of the insulation film 22 in correspondence with the channels 5. The arrows show the direction of the etching effect.

Figure 8:
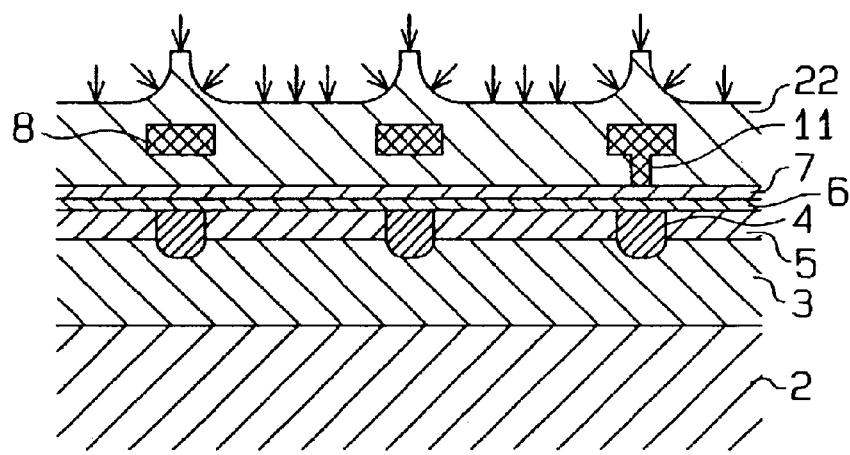
FIG. 8 is a cross-sectional diagram illustrating a sixth step performed when manufacturing the solid state imaging device of FIG. 1.

In a sixth step, which is illustrated in FIG. 8, the mask pattern 32 remaining on the insulation film 22 is eliminated. Then, isotropic etching (e.g., wet etching) is performed on the insulation film 22, which has undergone the anisotropic etching. The isotropic etching forms mountain-like prisms, the thickness of which continuously increases from opposite sides of each channel separating region 4 to the center 4c of the channel separating region 4, in the insulation film 22 above the channels 5.

In this manner, by performing isotropic etching after anisotropic etching, the insulation film 22 is easily shaped to form prisms with curves. The thickness of the prisms is adjusted by controlling the anisotropic etching time. The tangential angle θ is adjusted by controlling the isotropic etching time. By properly controlling the two etching processes, the desired shape may be accurately obtained at the predetermined position above each power supply line 8 even if the channel separating regions 4 are extremely narrow like in a frame transfer type solid state imaging device.

Figure 9:
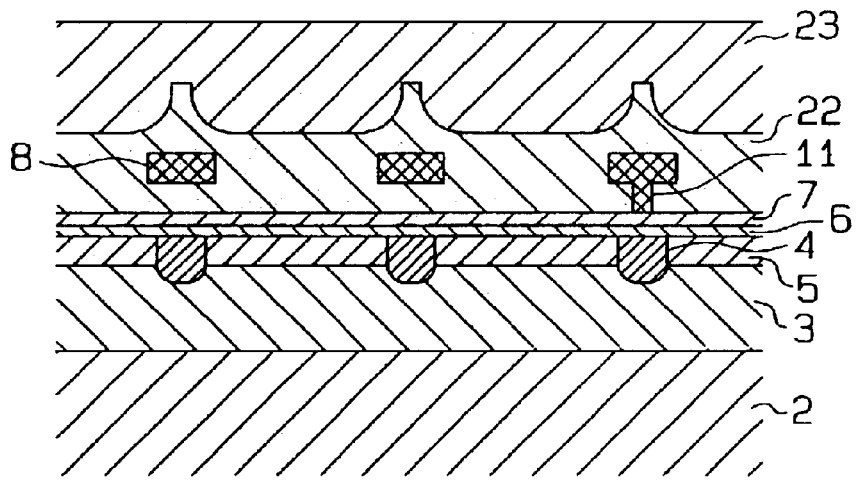
FIG. 9 is a cross-sectional diagram illustrating a seventh step performed when manufacturing the solid state imaging device of FIG. 1.

In a seventh step, which is illustrated in FIG. 9, plasma CVD is performed to laminate silicon nitrides on the silicon substrate 2 on which the insulation film 22 is formed. An etch back process or chemical mechanical polishing (CMP) is performed on the surface of the protection film 23 to flatten the surface.

In this manner, a solid state imaging device, which has the insulation film 22 and the protection film 23 shown in FIG. 1, is manufactured.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A solid state imaging device comprising:

a semiconductor substrate having a planar surface;

a plurality of channels arranged in parallel spaced from each other at predetermined intervals on the planar surface of the semiconductor substrate;

a plurality of channel separating regions with each region arranged between a pair of adjacent channels;

a plurality of transfer electrodes arranged on the semiconductor substrate along a direction intersecting the channels;

a plurality of power supply lines arranged on the transfer electrodes along the channel separating regions;

a transparent insulation film laminated on the transfer electrodes covering the power supply lines, the transparent insulation film including portions above the channels in which the thickness continuously increases from the center of each channel of a pair of adjacent channels to the channel separating region arranged between that pair of adjacent channels; and a transparent protection film laminated on the insulation film and having a refractive index that is greater than that of the insulation film, wherein the transparent insulation film includes second portions above the channel separating regions in which the thickness continuously decreases from the center of each region toward each channel of the pair of adjacent channels that each region is arranged between, in such a manner that a thickness decreasing ratio gradually decreases.

2. The solid state imaging device according to claim 1, further comprising a contact hole arranged selectively between the transfer electrodes and the corresponding power supply lines.

3. The solid state imaging device according to claim 1, wherein the refractive index of the insulation film is 1.4 to 1.5.

4. The solid state imaging device according to claim 3, wherein the insulation film includes a first layer, which is formed from silicon oxide, and a second layer, which is formed from a boron phosphorous silicate glass film, with the power supply lines formed on the first layer, and the second layer laminated on the power supply lines and the first layer.

5. The solid state imaging device according to claim 1, wherein the protection film is formed from silicon nitride.

6. A solid state imaging device comprising:
   a semiconductor substrate having a planar surface;
   a plurality of channels arranged in parallel spaced from each other at predetermined intervals on the planar surface of the semiconductor substrate;
   a plurality of channel separating regions with each region arranged between a pair of adjacent channels;
   a plurality of transfer electrodes arranged on the semiconductor substrate along a direction intersecting the channels;
   a plurality of power supply lines, each arranged on the transfer electrodes along the channel separating regions;
   a transparent insulation film laminated on the transfer electrodes covering the power supply lines, the transparent insulation film including prisms located above the power supply lines; and
   a transparent protection film laminated on the insulation film and having a refractive index that is greater than that of the insulation film, wherein the prisms include first portions above the channels in which the thickness continuously increases from the center of each channel of a pair of adjacent channels to the channel separating region arranged between that pair of adjacent channels, and second portions above the channel separating regions in which the thickness continuously decreases from the center of each region toward each channel of the adjacent pair of channels that each region is arranged between, in such a manner that a thickness decreasing ratio gradually decreases, and wherein each of the first portions is continuously connected to a corresponding one of the second portions.

7. The solid state imaging device according to claim 6, further comprising a contact hole arranged selectively between the transfer electrodes and the corresponding power supply lines.

8. The solid state imaging device according to claim 6, wherein the refractive index of the insulation film is 1.4 to 1.5.

9. The solid state imaging device according to claim 8, wherein the insulation film includes a first layer, which is formed from silicon oxide, and a second layer, which is formed from a boron phosphorous silicate glass film, and the power supply lines are formed on the first layer, the second layer is laminated on the power supply lines and the first layer, and the prisms are arranged on the second layer.

10. The solid state imaging device according to claim 6, wherein the protection film is formed from silicon nitride.

* * * * *